United States Patent
Takahashi et al.

(10) Patent No.: US 10,793,968 B2
(45) Date of Patent: Oct. 6, 2020

(54) METHOD OF PRODUCTION OF LANGATATE-BASED SINGLE CRYSTAL AND LANGATATE-BASED SINGLE CRYSTAL

(71) Applicants: CITIZEN FINEDEVICE CO., LTD., Yamanashi (JP); CITIZEN WATCH CO., LTD., Tokyo (JP)

(72) Inventors: Ikuo Takahashi, Yamanashi (JP); Takayuki Aoki, Yamanashi (JP); Youichi Nonogaki, Tokyo (JP); Yoshitaka Kinoshita, Tokyo (JP)

(73) Assignees: CITIZEN FINEDEVICE CO., LTD., Yamanashi (JP); CITIZEN WATCH CO., LTD., Tokyo (JP)

( * ) Notice: Subject to any disclaimer, the term of this patent is extended or adjusted under 35 U.S.C. 154(b) by 73 days.

(21) Appl. No.: 15/753,438

(22) PCT Filed: Aug. 18, 2016

(86) PCT No.: PCT/JP2016/074113
§ 371 (c)(1),
(2) Date: Feb. 19, 2018

(87) PCT Pub. No.: WO2017/030166
PCT Pub. Date: Feb. 23, 2017

(65) Prior Publication Data
US 2018/0245237 A1 Aug. 30, 2018

(30) Foreign Application Priority Data
Aug. 19, 2015 (JP) .................................. 2015-161709

(51) Int. Cl.
C30B 15/00 (2006.01)
C30B 15/10 (2006.01)
C30B 29/30 (2006.01)

(52) U.S. Cl.
CPC .............. *C30B 15/10* (2013.01); *C30B 15/00* (2013.01); *C30B 29/30* (2013.01)

(58) Field of Classification Search
CPC ................................. C30B 15/00; C30B 15/04
See application file for complete search history.

(56) References Cited

U.S. PATENT DOCUMENTS 6,514,336 B1 * 2/2003 Zavartsev ............... C30B 29/30
117/13
2008/0081013 A1 4/2008 Fududa et al.
(Continued)

FOREIGN PATENT DOCUMENTS

CN 102822394 A 12/2012
EP 2546393 A1 1/2013
(Continued)

OTHER PUBLICATIONS

Kawanaka et al "Growth and characterization of La3Ta.5Ge5.5O14 single crystals" Journal of Crystal Growth 183 274-277 1998.*
(Continued)

*Primary Examiner* — Robert M Kunemund

(57) ABSTRACT

A method of production of a high insulation resistance, high strength langatate-based single crystal and a langatate-based single crystal are provided. That is, a method of production of a langatate-based single crystal using the Czochralski method of pulling up a crystal from a starting material solution so as to grow a langatate-based single crystal, comprising placing the starting material solution of the single crystal in a platinum crucible and growing the single crystal using the Z-axis as the growth axis in a growth atmosphere of a mixed gas comprising an inert gas in which an oxidizing gas is contained in an amount greater than 5 vol %.

6 Claims, 2 Drawing Sheets

(56) References Cited

U.S. PATENT DOCUMENTS

2013/0001539 A1    1/2013    Meng et al.
2013/0015393 A1    1/2013    Hayashi et al.

FOREIGN PATENT DOCUMENTS

| JP | 2000-313697 | * 11/2000 |
| JP | 2000-313697 A | 11/2000 |
| JP | 2011-184263 A | 9/2011 |
| WO | 2006/106875 A1 | 10/2006 |

OTHER PUBLICATIONS

Jung et al "Growth of La Ba Ta Ga O compunds for the high temperature piezoelectric applications" Journal of Crystal Growth 262 pp. 40-47 2004.*
International Search Report for PCT/JP2016/074113, dated Sep. 13, 2016.
Written Opinion of the International Searching Authority for PCT/JP2016/074113, dated Sep. 13, 2016.
European Patent Office, Supplementary European Search Report for European Patent Application No. EP 16 83 7155, dated Jan. 31, 2019.
Hiromitsu Kimura et al., "The effect of growth atmosphere and Ir contamination on electric properties of La3Ta0.5Ga5.5014 signal crystal grown by the floating zone and Czochralski method", Journal of Electroceramics, vol. 20, No. 2, Oct. 30, 2007, pp. 73-80.
China National Intellectual Property Administration, First Office Action for Chinese Patent Application No. 201680048382.2, dated Sep. 25, 2019.

* cited by examiner

METHOD OF PRODUCTION OF LANGATATE-BASED SINGLE CRYSTAL AND LANGATATE-BASED SINGLE CRYSTAL

TECHNICAL FIELD

The present invention relates to a method of production of a high insulation, high stability piezoelectric oxide crystal. More preferably, the present invention relates to a method of production of a langatate-based single crystal of a piezoelectric oxide suitable for use as a piezoelectric element of a combustion pressure sensor for measuring a combustion pressure inside a combustion chamber of an internal combustion engine etc. The present invention further relates to a langatate-based single crystal obtained by this method of production.

BACKGROUND ART

For example, in an automobile utilizing an internal combustion engine, the practice has been to detect the combustion pressure at the inside of a combustion chamber so as to control the amount of feed of fuel or ignition timing for optimum control of combustion to deal with misfires or abnormal combustion etc. To detect the combustion pressure inside a combustion chamber, in general a combustion pressure sensor utilizing an element of an oxide piezoelectric material exhibiting a piezoelectric effect (where charge is generated as a result of polarization occurring corresponding to applied force (pressure)) is used.

In a piezoelectric element of a combustion pressure sensor, a single crystal of an oxide piezoelectric material is used. In the past, as the oxide piezoelectric material, quartz has been used. Further, starting in the early 1990s, langasite ($LGS:La_3Ga_5SiO_{14}$), which has a larger piezoelectric constant than quartz, became the focus of attention. Research was conducted centering on langanite ($LGN:La_3Ga_{5.5}Nb_{0.5}O_{14}$) having the same structure as langasite. After that, due to the small change of its piezoelectric constant due to temperature and high insulation property, langatate ($LTG:La_3Ta_{0.5}Ga_{5.5}O_{14}$) became focused on. Currently, LTG is being broadly used. Further, LTGA ($La_3Ta_{0.5}Ga_{5.5-x}Al_xO_{14}$ (x=0.2 or so is mainstream)), where part of the Ga of LTG is substituted by Al, has also been known since 10 years or more in the past. LTGA has recently come under attention due to exhibiting a higher insulation resistance than LTG (PLT 1).

LTGA single crystal is produced by weighing out the starting materials of $La_2O_3$, $Ta_2O_5$, $Ga_2O_3$, and $Al_2O_3$ to give the targeted stoichiochemical single crystal composition, calcining the mixture to prepare an LTGA sintered body (polycrystalline material), making it melt, dipping a seed crystal in the melt, and gradually pulling it up to obtain a single crystal (Czochralski method (CZ method)) etc.

PLT 1 describes a method of production of a langatate-based single crystal according to the Czochralski method comprising growing a single crystal in a growth atmosphere of a gas comprised of an inert gas in which oxygen is mixed at a maximum of 2% and cooling it in an atmosphere lowered in oxygen concentration from the growth atmosphere, further describes gradually cooling the produced single crystal down to room temperature (annealing it), then heat treating it in an inert gas atmosphere not containing an oxidizing gas to thereby reduce the coloring due to defects and reduce the temperature dependency of the resistivity, and describes a 100 to 600° C. high temperature use piezoelectric sensor using a piezoelectric element comprised of a single crystal heat treated in this way (combustion pressure sensor).

Further, when producing a single crystal of an oxide piezoelectric material from a melt to obtain a high insulation, high stability LTGA single crystal, it is known to make the mixing ratio of the lanthanum oxide, tantalum oxide, and gallium oxide of the starting materials change from the stoichiochemical composition and grow the single crystal in a growth atmosphere of a mixed gas with a concentration of oxygen in the inert gas of 0.2 to 5% (for example, see PLT 2).

CITATION LIST

Patent Literature

PLT 1: WO2006/106875A pamphlet PLT 2: Japanese Patent Publication No. 2011-184263A

SUMMARY OF INVENTION

Technical Problem

A piezoelectric material used in a piezoelectric element of a combustion pressure sensor is required to have a high insulating property (large resistivity of piezoelectric material) and a certain amount or more of strength at which cracking and other failure do not occur due to the pressure acting on the piezoelectric element. Specifically, due to the need for operation at a high temperature in an internal combustion engine, an insulation resistance of $3 \times 10^8$ Ω·cm or more at 500° C. is demanded. Due to the need to be utilized in an internal combustion engine of an automobile, resistance to failure due to a 30 MPa or more pressure is sought.

In this regard, however, in langatate-based single crystals up to now, it has been difficult to obtain a langatate-based single crystal satisfying both the conditions of insulation resistance and strength required for a piezoelectric material used for an internal combustion engine for automobile use.

The present invention has as its object the provision of a method solving this problem and enabling the production of a high insulation, high strength langatate-based single crystal able to be used for a piezoelectric element of a high reliability combustion pressure sensor useful for measurement of the combustion pressure inside an internal combustion engine combustion chamber. Provision of a langatate-based single crystal obtained by this method of production is another object of the present invention.

Solution to Problem

The method of production of a langatate-based single crystal of the present invention is a method of production of a langatate-based single crystal using the Czochralski method of pulling up a crystal from a starting material solution so as to grow a langatate-based single crystal, wherein an atmospheric gas growing the langatate-based single crystal is a mixed gas comprised of an inert gas in which an oxidizing gas is contained in an amount greater than 5 vol %.

Preferably the starting material solution is held in a platinum crucible to grow the langatate-based single crystal. Further, the single crystal growth axis is preferably a Z-axis, and the oxidizing gas is preferably $O_2$.

The langatate-based single crystal of the present invention has a compressive fracture strength in the X-axial direction at 200° C. of 1500 MPa or more.

The langatate-based single crystal of the present invention may further have an insulation resistance at 500° C. of $3.0 \times 10^9$ Ω·cm or more.

Further, the langatate-based single crystal of the present invention may be $La_3Ta_{0.5}Ga_{5.5-x}Al_xO_{14}$ (0<x<5.5).

Advantageous Effect of Invention

According to the present invention, it is possible to realize a langatate-based single crystal with a high insulation resistance after growth and with a high strength. Due to the use of a piezoelectric element prepared from the langatate-based single crystal of the present invention, it is possible to utilize this for applications such as a combustion pressure sensor measuring the combustion pressure of an internal combustion engine in which measurement of a high pressure becomes necessary.

DESCRIPTION OF EMBODIMENTS

The present invention relates to a langatate-based single crystal and a method of production of the same. A "langatate-based single crystal" generally is a single crystal of a compound represented by the formula $La_3Ta_{0.5}Ga_{5.5}O_{14}$ (here, sometimes abbreviated as "LTG"). The "langatate-based single crystal" referred to here also includes LTGA where part of the Ga is substituted by Al ($La_3Ta_{0.5}Ga_{5.5-x}Al_xO_{14}$ (0<x<5.5)) (here, sometimes abbreviated as "LTGA").

It is also possible to produce an LTGA single crystal from polycrystalline starting materials of a composition represented by the following formula y $(La_2O_3)+(1-x-y-z)(Ta_2O_5)+z(Ga_2O_3)+x(Al_2O_3)$ (in which formula, 0<x≤0.40/9, 3.00/9<y≤3.23/9, 5.00/9≤z<5.50/9, more preferably, 0.17/9≤x≤0.26/9, 3.06/9≤y≤3.15/9, 5.14/9≤z≤5.32/9) as the starting materials for the production of an LTGA single crystal. The starting materials $La_2O_3$, $Ta_2O_5$, $Ga_2O_3$, and $Al_2O_3$ can be weighed out to give a desired composition and mixed by a ball mill etc. to prepare a starting material mixture. Next, the prepared starting material mixture can be pressed, then calcined to prepare a sintered body of a structure of the crystal targeted by a solid phase reaction. The sintered body prepared in the above way generally includes numerous polycrystals.

The method of production of the langatate-based single crystal generally comprises growing a single crystal from a molten starting material. For example, the Czochralski method (CZ method) of dipping a seed crystal in a melt of a polycrystalline material in a crucible and gradually pulling it up to obtain a single crystal may be mentioned. More specifically, it is possible to fill the above prepared sintered body in a crucible, heat the crucible to melt the sintered body inside the crucible, make the seed crystal with the crystal orientation contact the melt surface while making it rotate, then pull up the seed crystal from the melt for Z-axial growth of the single crystal and grow the LTGA single crystal. (The Z-axial direction in Z-axis growth indicates the main axis (c-axis) direction of the seed crystal and is also called the "single crystal growth axis". The a-axial direction vertical to the Z-axis is defined as the X-axis.) After that, the grown LTGA single crystal can be cut off from the melt and cooled down to room temperature to thereby complete the LTGA single crystal.

Figure 1:
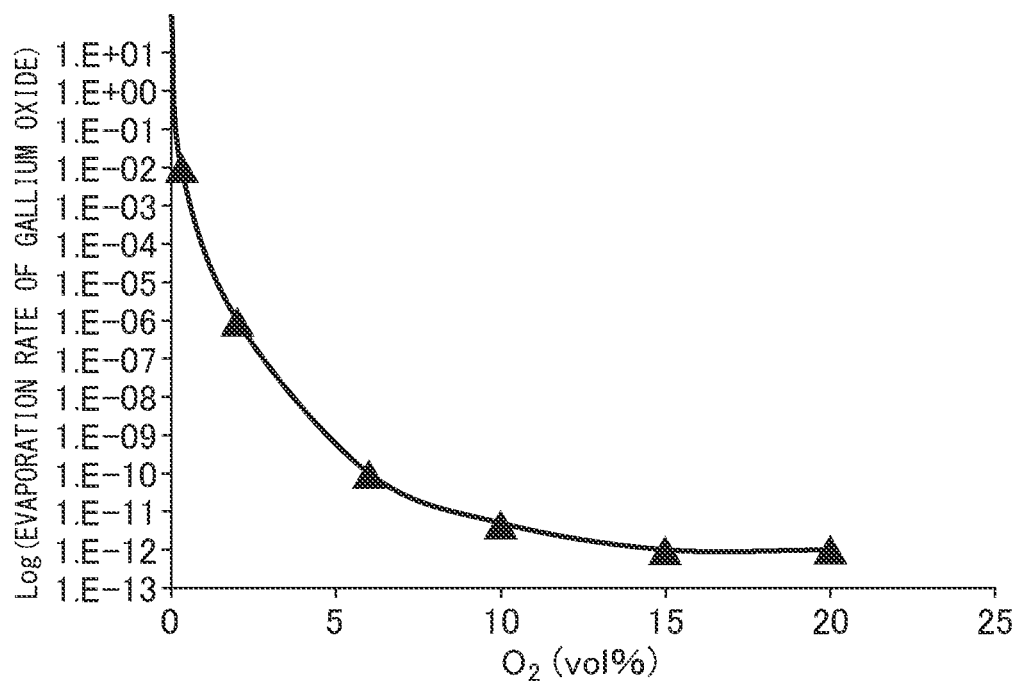
FIG. 1 is a view showing a relationship of an oxygen concentration in a growth atmosphere and an amount of evaporation of gallium.

In the production of a langatate-based single crystal by the Czochralski method, the crystal is grown in a mixed gas atmosphere comprised of an inert gas including oxygen or another oxidizing gas. It is known that by growing the crystal in a mixed gas atmosphere including an oxidizing gas, the gallium in the melt in the crucible can be kept from evaporating. FIG. 1 is a view showing a relationship of an oxygen concentration of the growth atmosphere and the amount of evaporation of gallium. The "evaporation rate of gallium" here is a relative value indexed to the evaporation rate as 1 when the oxygen concentration in the atmosphere is 0 vol %. Along with a rise in the oxygen concentration of the growth atmosphere, the amount of evaporation of gallium in the starting material melt falls. Evaporation of gallium in the starting material melt becomes a cause of the formation of gallium defects of partially missing gallium inside the grown single crystal. By growing the crystal in an atmosphere containing an oxidizing gas, the amount of evaporation of the gallium from the melt falls and the gallium defects contained in the grown single crystal can be reduced.

In this regard, it is known that growth in an atmosphere containing an oxidizing gas enables reduction of gallium defects, while with the oxide of the langatate-based single crystal, oxygen defects are formed due to the effects of the oxygen partial pressure. Furthermore, if the oxidizing gas concentration of the growth atmosphere is high, there is the problem that the crucible becomes increasingly oxidized and the service life of the crucible becomes shorter. In the past, considering this point, as the growth atmosphere of the langatate-based single crystal, it was considered that a mixed gas comprised of an inert gas in which several % of oxidizing gas is included, specifically, a mixed gas with an oxidizing gas concentration of 5 vol % or less, in particular 0.3 to 2 vol %, may be used.

However, the inventors discovered that by making the concentration of oxidizing gas in the inert gas in the growth atmosphere higher than the prior art, specifically, making the oxygen or other oxidizing gas concentration higher than 5 vol %, a high insulation resistance, high strength langatate-based single crystal can be realized. By growing the crystal in a growth atmosphere with a high oxidizing gas concentration, it is possible to produce a single crystal with few gallium defects. This is believed to be the reason why a high insulation resistance, high strength single crystal is obtained. To enhance this effect, the lower limit of the oxygen concentration may be made 6 vol %, still more preferably may be made 10 vol %. The insulation resistance measured at 500° C. of the langatate-based single crystal obtained according to the present invention was $3.4 \times 10^9$ to $6.5 \times 10^9$ Ω·cm in range. The insulation resistance required as the combustion pressure sensor is $3.0 \times 10^8$ Ω·cm or more at 500° C., preferably $3.0 \times 10^9$ Ω·cm or more, more preferably $3.4 \times 10^9$ Ω·cm or more, still more preferably $6.3 \times 10^9$ Ω·cm or more. The piezoelectric material used in the piezoelectric element of the combustion pressure sensor is required to have an insulation resistance of $3 \times 10^8$ Ω·cm or more at 500° C. due to the need to operate at a high temperature in an internal combustion engine, but by making the oxygen or other oxidizing gas concentration higher than 5 vol % like in the present invention, the langatate-based single crystal can satisfy this demand. The langatate-based single crystal according to the present invention is confirmed to have an insulation resistance of $6.5 \times 10^9$ Ω·cm. This may be made the upper limit of the insulation resistance according to the present invention. The insulation resistance will be explained later using FIG. 2. Further, the compressive fracture strength in the X-axial direction at 200° C. of the langatate-based single crystal obtained according to the present invention is 1500 MPa or more, preferably 1700 MPa or more, more preferably 1750 MPa or more. The piezoelectric material used in the piezoelectric element of a combustion pressure sensor is required to not fracture due to a 30 MPa or more pressure due to the need to be utilized in the internal combustion engine of an automobile, but the langatate-based single crystal of the present invention can satisfy this demand. The langatate-based single crystal according to the present invention is confirmed to also have a 1875 MPa compressive fracture strength. This may also be made the upper limit of the compressive fracture strength according to the present invention. The compressive fracture strength will be explained later using FIG. 3.

Here, with growth in a high concentration oxidizing gas atmosphere, the oxygen defects increase as explained above. Due to the increase in the oxygen defects, the insulation resistance and strength are liable to be reduced, but gallium defects formed due to the gallium evaporated from the melt surface during growth are defects formed over the entire area of the grown single crystal, while the oxygen defects formed due to leakage of molecules to the outside due to the oxygen partial pressure of the growth atmosphere of the outside environment of crystal growth are defects mainly formed at the surface layer side of the single crystal, so it is believed that compared with oxygen defects, the presence of gallium defects has a greater effect on the insulation resistance, strength, and other characteristics of the single crystal and as a result the oxidizing gas concentration is made high so it is possible to obtain the above-mentioned high insulation resistance ($3.0 \times 10^9$ to $6.5 \times 10^9$ Ω·cm), high strength (1500 to 1875 MPa) single crystal. Further, the fact that, compared with oxygen, gallium has a larger ion radius and atomic radius is believed to be one reason why the effect of the presence of gallium defects has a larger effect on the characteristics of the single crystal compared with oxygen defects. The upper limit of the oxygen concentration is not particularly limited. However, when raising the oxygen concentration a certain extent or more, a trend for the insulation resistance, strength, and other characteristics to become saturated is seen and the service life of the crucible becomes shorter etc., so the upper limit of the oxygen concentration may be made 15 vol % or may be made 10 vol %.

In the present invention, as the crucible holding the melt of the polycrystalline material, one made of iridium, platinum, platinum alloy, reinforced platinum comprised of platinum in which metal oxide is dispersed, etc. can be used, but in particular utilization of one made of platinum, a platinum alloy, or a reinforced platinum or mainly comprised of platinum, that is, a so-called "platinum crucible", is preferable. The platinum crucible has a platinum purity of 85% or more, preferably 90% or more, more preferably 95% or more, still more preferably 100%. Platinum has an evaporation rate lower than iridium. If indexed to the evaporation rate of iridium as 100, platinum is about 8. The evaporation rate of the crucible in the production of a single crystal is one of the important factors for obtaining a single crystal with good characteristics. The crucible evaporates during growth of the single crystal, so fine particles of precious metal of the evaporated crucible ingredients contaminate the single crystal being grown, cause physical strain in the single crystal, and cause cracks in the single crystal. By using a platinum-based crucible with a low evaporation rate, it is possible to suppress defects due to evaporation of the crucible. Further, a platinum-based crucible is resistant to oxidation, so its service life is long. Due to the resistance to oxidation, the crucible is suitable for the present invention where the crystal is grown at a high oxidizing gas concentration. The langatate-based single crystal obtained utilizing a platinum crucible is substantially not contaminated by elements other than the platinum contained in the platinum crucible. That is, the langatate-based single crystal according to the present invention may also be one substantially not containing iridium etc. "Substantially not containing" indicates the level of unavoidable impurities and may be less than $10^{15}$ at/cm$^3$, preferably less than $10^{13}$ at/cm$^3$, more preferably less than $10^{11}$ at/cm$^3$. Further, the langatate-based single crystal according to the present invention sometimes includes a slight amount of platinum derived from the platinum crucible. The concentration is from $10^{11}$ at/cm$^3$ to about $10^{15}$ at/cm$^3$, but there is no effect on the insulation resistance.

Further, in the present invention, the growth axis of the single crystal may be made the Z-axis. When growing a single crystal by the Czochralski method, a seed crystal is dipped in a melt and gradually pulled up to obtain a single crystal. For this reason, sometimes the pullup speed of the single crystal etc. cause the distance between atoms of the single crystal in the pullup axial direction to depart from the ideal one and strain to be generated in the single crystal. A piezoelectric material exhibits a piezoelectric effect dependent on the crystal axis direction, but if there is strain in the crystal axis generating a charge, the piezoelectric characteristics are affected. Therefore, in the present invention, by growing the crystal by pulling it up in the Z-axial direction where no charge is generated even if a load acts, a method of production of a single crystal suppressed in generation of strain during growth can be realized.

EXAMPLE 1

Below, the langatate-based single crystal and its method of production of the present invention will be explained with reference to the example of the langatate-based single crystal of LTGA.

Known in the art is an LTGA single crystal grown from polycrystalline starting materials of a composition represented by the following formula y $(La_2O_3)$+(1−x−y−z) $(Ta_2O_5)$+z $(Ga_2O_3)$+x $(Al_2O_3)$ (in which formula, $0 < x \le 0.40/9$, $3.00/9 < y \le 3.23/9$, $5.00/9 \le z < 5.50/9$, more preferably, $0.17/9 \le x \le 0.26/9$, $3.06/9 \le y \le 3.15/9$, $5.14/9 \le z \le 5.32/9$) as the starting materials of production of the LTGA single crystal (see PLT 2). In this example, an LTGA single crystal is produced from starting materials of a composition represented by $3.139/9$ $(La_2O_3)$+$0.488/9$ $(Ta_2O_5)$+$5.167/9$ $(Ga_2O_3)$+$0.206/9$ $(Al_2O_3)$.

The starting materials $La_2O_3$, $Ta_2O_5$, $Ga_2O_3$, and $Al_2O_3$ were weighed out in amounts of 160.7 g, 33.9 g, 152.2 g, and 3.3 g and were dry mixed by a ball mill for 8 hours or more to prepare a starting material mixture.

Next, the starting material mixture was pressed by a 1 ton isostatic press, then was calcined to prepare a sintered body of a structure of the targeted crystal by a solid phase reaction. The temperature elevation conditions at this time were a temperature elevation speed of 180° C./h, holding at 500° C. for 2 hours, holding at 900° C. for 2 hours, and holding at 1350° C. for 5 hours.

Next, a reinforced platinum crucible comprised of platinum in which a metal oxide was dispersed was packed with 350 g of a sintered body. This crucible was placed in a heating chamber where the crucible was heated by direct induction heating to melt the sintered body inside the crucible (melt surface temperature 1500° C.). The seed crystal with the crystal orientation was made to contact the melt surface while making it rotate at 10 rpm, then the seed crystal was pulled up from the melt to prepare a shoulder part by automatic control utilizing a computer, then the single crystal was grown by Z-axial growth again by automatic control utilizing a computer to prepare a diameter 50 mm, body length 70 mm LTGA single crystal. Next, the single crystal was made to rise to separate from the melt and was cooled down to room temperature by automatic control utilizing a computer, then was taken out from the chamber whereby the LTGA single crystal was completed. The growth atmosphere of the LTGA single crystal was made a mixed gas atmosphere comprised of a nitrogen gas atmosphere containing 6 to 15 vol % of oxygen or another oxidizing gas. The LTGA single crystal was cooled under the same atmosphere.

The insulation resistance of the completed single crystal measured at 500° C. was $3.4 \times 10^9$ to $6.5 \times 10^9$ Ω·cm in range. The insulation resistance was measured by cutting out a wafer for measurement of resistivity from a grown single crystal block and forming electrodes so as to not short-circuit between bulks desired to be measured, placing the obtained measurement use sample inside a test tube shaped furnace, raising the furnace temperature to 500° C., and measuring the resistance when the temperature of the sample wafer reaches 500° C. Further, the compressive fracture load of the single crystal in the X-axial direction was 6800 to 7500N. The compressive fracture load is the load when the single crystal breaks when clamping the y-z surfaces of a single crystal cut out to 2×2×2 mm along the axis by a carbide jig and compressing the single crystal in the X-axial direction in a 200° C. environment by a speed of 0.5 mm/min. If finding the stress value from the value of the fracture load divided by the area over which the load is applied (2 mm×2 mm), it is calculated that the crystal has a 1500 MPa to 1875 MPa compressive fracture strength.

Comparative Example

An LTGA single crystal was produced under conditions making the oxygen concentration of the growth atmosphere of the LTGA single crystal explained in Example 1 (oxidizing gas concentration) 0.3 to 2 vol %, gradually lowering the oxygen concentration in the cooling atmosphere from the growth atmosphere, and cooling the crystal in an inert gas atmosphere. The oxygen concentration is made lower at the time of cooling than the growth atmosphere so as to suppress the formation of oxygen defects and thereby obtain a high insulation resistance and reduce the temperature dependency of the insulation resistance. The insulation resistance measured at 500° C. of the completed single crystal was $5.3 \times 10^8$ to $1.37 \times 10^9$ Ω·cm. The compressive fracture load of the single crystal in the X-axial direction was 4700 to 5500N (if converted to compressive fracture strength, 1175 MPa to 1375 MPa).

Figure 2:
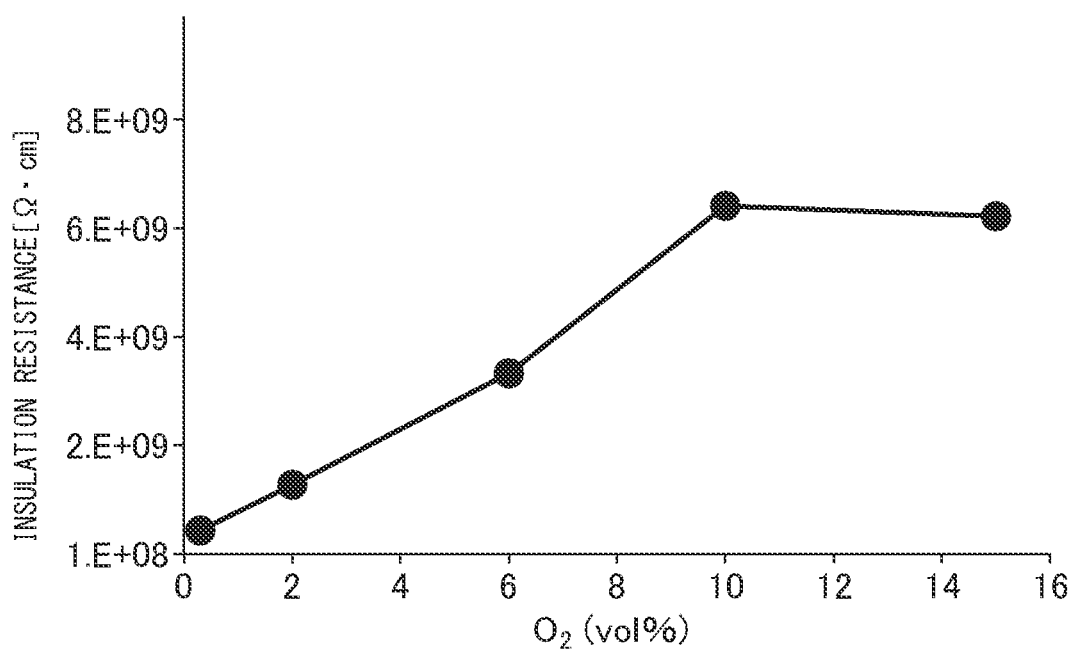
FIG. 2 is a view showing a relationship of an oxygen concentration at the time of growth and an insulation resistance of LTGA.
Figure 3:
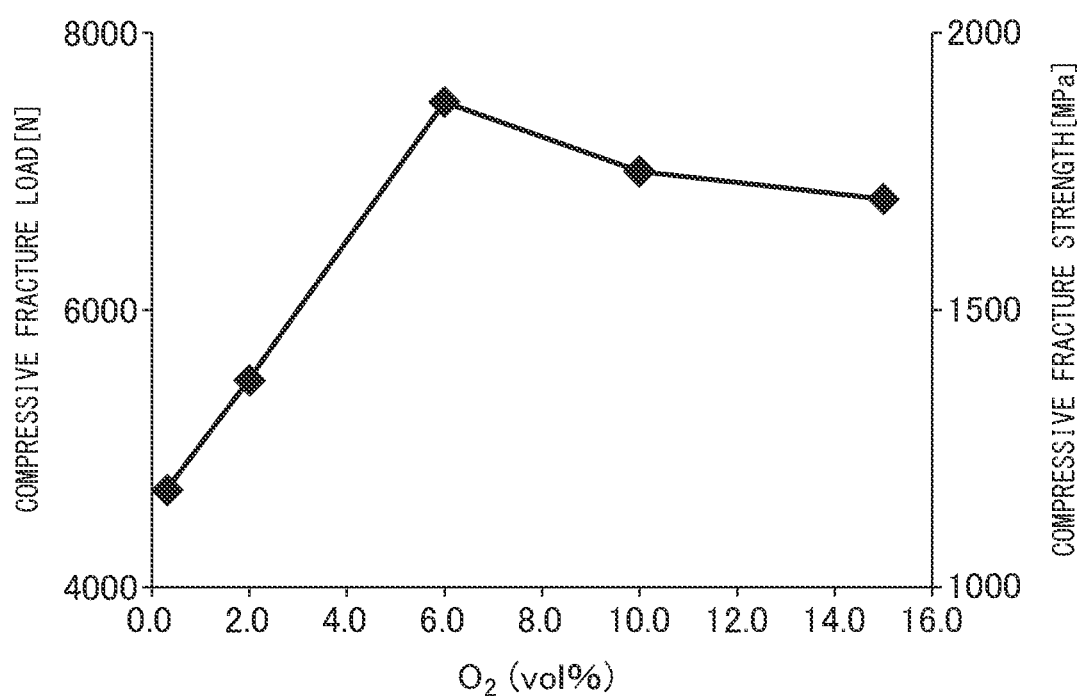
FIG. 3 is a view showing a relationship of an oxygen concentration at the time of growth and a compressive fracture strength of LTGA.

Regarding the insulation resistance, a higher insulation resistance was obtained in Example 1 compared with the comparative example. In the comparative example, the oxygen concentration is lowered at the time of cooling so as to produce a single crystal under conditions keeping down the formation of oxygen defects, while in Example 1, it is possible to obtain a high insulation resistance regardless of the crystal having been produced under conditions susceptible to formation of oxygen defects at the time of cooling. Further, in the compressive fracture strength, a higher strength could be obtained in Example 1 compared with the comparative example. FIG. 2 is a view showing a relationship of an oxygen concentration at the time of growth and an insulation resistance of LTGA, while FIG. 3 is a view showing a relationship of an oxygen concentration at the time of growth and a compressive fracture strength of LTGA. The higher the oxygen concentration of the single crystal growth atmosphere, the higher the values of the insulation resistance and the compressive fracture strength. From FIG. 2 and FIG. 3, it will be understood that according to the method of production of the present invention, compared with a single crystal grown in a growth atmosphere containing a conventional 5 vol % or lower oxygen or other oxidizing gas, the absolute value of the insulation resistance rises and a high strength single crystal is obtained. Furthermore, due to the small number of gallium defects in the single crystal, a single crystal with a smaller change in insulation resistance with respect to a change in temperature can be expected to be obtained. Further, it will be understood that the single crystal obtained by the method of production of the present invention is high in insulation resistance and high in strength.

Above, the langatate-based single crystal and the method of production of the same of the present invention were explained based on embodiments, but the present invention is not limited to such embodiment and may be freely changed, added to, or deleted from within a range not departing from the gist of the present invention.

The invention claimed is:

1. A method of production of a langatate-based single crystal using the Czochralski method of pulling up a crystal from a starting material solution so as to grow a langatate-based single crystal having an insulation resistance at 500° C. of $3.0 \times 10^9$ Ω·cm or more and a compressive fracture strength in the X-axial direction at 200° C. of 1500 MPa or more,
    wherein an atmospheric gas growing said langatate-based single crystal is a mixed gas comprised of an inert gas in which an amount of an oxidizing gas is in a range of 6-15 vol %.

2. The method of production of a langatate-based single crystal according to claim 1, comprising holding said starting material solution in a platinum crucible to grow said langatate-based single crystal.

3. The method of production of a langatate-based single crystal according to claim 1, wherein said oxidizing gas is $O_2$.

4. The method of production of a langatate-based single crystal according to claim 1, wherein the single crystal growth axis is a Z-axis.

5. A langatate-based single crystal wherein the langatate-based single crystal has a compressive fracture strength in the X-axial direction at 200° C. of 1500 MPa or more and an insulation resistance at 500° C. of $3.0 \times 10^9$ Ω·cm or more.

6. The langatate-based single crystal according to claim 5, wherein said langatate-based single crystal is $La_3Ta_{0.5}Ga_{5.5-x}Al_xO_{14}$ ($0<x<5.5$).

* * * * *